United States Patent
Easter et al.

(10) Patent No.: US 6,368,955 B1
(45) Date of Patent: Apr. 9, 2002

(54) METHOD OF POLISHING SEMICONDUCTOR STRUCTURES USING A TWO-STEP CHEMICAL MECHANICAL PLANARIZATION WITH SLURRY PARTICLES HAVING DIFFERENT PARTICLE BULK DENSITIES

(75) Inventors: William Graham Easter; John Albert Maze, III; Frank Miceli, all of Orlando, FL (US)

(73) Assignee: Lucent Technologies, Inc., Murray Hill, NJ (US)

( * ) Notice: Subject to any disclaimer, the term of this patent is extended or adjusted under 35 U.S.C. 154(b) by 0 days.

(21) Appl. No.: 09/444,817

(22) Filed: Nov. 22, 1999

(51) Int. Cl.[7] .......................................... H01L 21/4763
(52) U.S. Cl. ...................... 438/633; 438/626; 438/692
(58) Field of Search ................................ 438/626, 631, 438/633, 645, 690–693, 959

(56) References Cited

U.S. PATENT DOCUMENTS

| | | | |
|---|---|---|---|
| 5,486,129 A | * | 1/1996 | Sandhu et al. ................. 451/5 |
| 5,540,810 A | | 7/1996 | Sandhu et al. |
| 5,597,346 A | | 1/1997 | Hempel, Jr. |
| 5,618,381 A | | 4/1997 | Doan et al. |
| 5,676,587 A | | 10/1997 | Landers et al. |
| 5,863,307 A | | 1/1999 | Zhou et al. |
| 5,897,375 A | | 4/1999 | Watts et al. |
| 6,001,730 A | * | 12/1999 | Farkas et al. ................. 438/627 |
| 6,074,949 A | * | 6/2000 | Schonauer et al. ........... 438/692 |
| 6,114,215 A | * | 9/2000 | Osugi et al. .................. 438/401 |
| 6,136,714 A | * | 10/2000 | Schutz ......................... 438/692 |

OTHER PUBLICATIONS

S. Ramarajan et al., The Role of Alumina Particle Hardness/Elatic Modulus in Chemical–Mechanical Polishing of Copper, Tantalum and Tungsten, pp. 430–437, Feb. 11–12, 1999, CMP–MIC Conference, 1999 IMIC—400P/99/0430.

* cited by examiner

Primary Examiner—Carl Whitehead, Jr.
Assistant Examiner—Jamie L. Brophy
(74) Attorney, Agent, or Firm—Alston & Bird LLP

(57) ABSTRACT

The present invention is a method for removing a portion of a liner film and a metallization layer superimposed over the liner film to expose an underlying dielectric layer on a semiconductor wafer. Specifically, at least a portion of the metallization layer is removed by chemical mechanical polishing the metallization layer using a first polishing slurry having a plurality of first abrasive particles and at least a portion of the liner film is removed by chemical mechanical polishing the liner film using a second polishing slurry having a plurality of second abrasive particles. The first abrasive particles and the second abrasive particles used in the polishing steps have different bulk densities.

20 Claims, 2 Drawing Sheets

METHOD OF POLISHING SEMICONDUCTOR STRUCTURES USING A TWO-STEP CHEMICAL MECHANICAL PLANARIZATION WITH SLURRY PARTICLES HAVING DIFFERENT PARTICLE BULK DENSITIES

FIELD OF THE INVENTION

This invention relates generally to integrated circuit manufacturing and, particularly to chemical mechanical polishing processes for manufacturing integrated circuits.

BACKGROUND OF THE INVENTION

Integrated circuits are chemically and physically integrated into a substrate such as a silicon or gallium arsenide wafer by patterning layers on a substrate. In particular, semiconductors are formed by providing tungsten or copper wiring or metallization in discrete layers of dielectric films to form a multilayer structure. The metallization is adhered to the dielectric film through a thin liner film comprising tantalum (Ta), tantalum nitride (TaN), titanium (Ti), or titanium nitride (TiN). The metallization layer and the liner film are deposited on a patterned dielectric film and then polished, typically by chemical-mechanical planarization (CMP), to expose the dielectric layer.

FIG. 1 shows an example of a preformed semiconductor structure 10 after deposition of the metallization and the liner film and prior to polishing. Generally, to make the semiconductor structure 10, a dielectric layer 12 is deposited on a semiconductor substrate or wafer 11 such as a silicon or gallium arsenide wafer and planarized. The dielectric layer 12 typically contains silicon dioxide (SiO$_2$), borophosphosilicate glass (BPSG), or phosphosilicate glass (PSG). After the surface of the dielectric layer 12 is planarized, it is etched to form a series of trenches (lines) and holes (vias) therein according to a prototype design. For example, FIG. 1 illustrates a trench 13. Thereafter, a thin liner film 14 of tantalum (Ta) and tantalum nitride (TaN) or titanium (Ti) and titanium nitride (TiN) is formed over the etched surface of the dielectric layer including the trenches and holes. A metal such as copper or tungsten is then superimposed over the liner film to form a metallization layer 16 filling the trenches and holes. After the semiconductor structure 10 is formed, the portion of the metallization layer and the liner film that is outside the trenches or holes is removed from the dielectric surface typically by a chemical-mechanical planarization (CMP) process to expose the underlying dielectric layer. Thereafter, the exposed dielectric surface is buffed, i.e., polished or replanarized, to remove any defects such as scratches or embedded particles formed in the dielectric surface during the CMP process.

The CMP process is a well known technique in the semiconductor manufacturing industry. In a typical CMP process, the surface of the semiconductor material to be polished is held against a polishing pad at a predetermined pressure while the polishing pad rotates at a predetermined angular speed. The wafer may also rotate. A polishing slurry is supplied to the interface between the polishing pad and the semiconductor material surface to be polished. Typically, the polishing slurry comprises an abrasive agent such as alumina, silica, or ceria particles for mechanical polishing, and an oxidizing agent at a specific pH for chemically etching or oxidizing the surface of the semiconductor material.

In CMP polishing the semiconductor material 10 illustrated in FIG. 1, the metallization layer 16 is generally removed first followed by the liner film 14. However, where trenches or holes are present in the dielectric film 12, the metallization that overlies the trenches or holes is polished while the liner film 14 outside of the trenches and holes is polished. Because the materials used in the metallization layer 16 and liner film 14 are different, they polish at different removal rates. When the metallization layer 16 is removed at a quicker rate than the liner film 14, overpolishing or dishing occurs in the trenches or holes, which detrimentally affects the performance of the integrated circuit. Alternatively, when the liner film 14 is removed at a faster rate than the metallization layer 16, the dielectric layer will be removed at a faster rate thereby reducing the planarity of the resulting structure.

When copper is used as the material in the metallization layer 16, dishing or overpolishing and dielectric erosion can be serious problems. In particular, copper is typically softer and polishes at a faster rate than the metals used in the liner film 14. Thus, the copper in the trenches or holes is removed at a faster rate than the liner film 14 thus causing dishing or overpolishing as shown in FIG. 2. Furthermore, as shown in FIG. 2, as overpolishing of the copper is taking place in the trenches or holes, a portion of the dielectric film adjacent the trenches or holes can be can be worn away resulting in dielectric erosion.

As is well understood in the art, the formation of planar layers is essential in the production of semiconductor structures. Thus, it is desirable to provide an improved CMP method that provides good planarization without dishing or dielectric erosion.

SUMMARY OF THE INVENTION

The present invention is directed to a method for removing a liner film and a metallization layer superimposed over the liner film from the surface of an underlying dielectric layer on a semiconductor wafer. The method comprises at least two steps. In the first step, a first polishing slurry having a plurality of first abrasive particles is used in a chemical mechanical polishing process to remove at least a portion of the metallization layer. In the second step, a second polishing slurry having a plurality of second abrasive particles is used in a chemical mechanical polishing process to remove at least a portion of the liner film. The first abrasive particles and the second abrasive particles have different bulk densities in accordance with the invention.

In a preferred embodiment, the present invention provides a method for removing a copper layer and a liner film from the surface of a dielectric layer on a semiconductor wafer. The method comprises at least two CMP polishing steps. First, at least a portion of the copper layer superimposed over the liner film is removed by a CMP process using a first slurry containing alumina particles as the abrasive agent. Subsequently, a CMP process is employed to remove at least a portion of the liner film using a second polishing slurry containing silica particles having a bulk density that is less than the bulk density of the alumina particles used in the first slurry. The higher bulk density of the abrasive agent in the first step enables the removal of the copper layer at a high speed while the decrease in bulk density in the second step leads to the reduction of the copper polishing rate thus preventing overpolishing of the copper in the metallization trenches or holes and erosion of the dielectric material at the edge of trenches. Thus, the combination of the two separate steps can effectively minimize dishing and erosion without sacrificing the overall speed of the planarization process.

The foregoing and other advantages and features of the invention, and the manner in which the same are accomplished, will become more readily apparent upon consideration of the following detailed description and corresponding drawings, which illustrate preferred and exemplary embodiments of the invention.

DETAILED DESCRIPTION OF THE INVENTION

Figure 1:
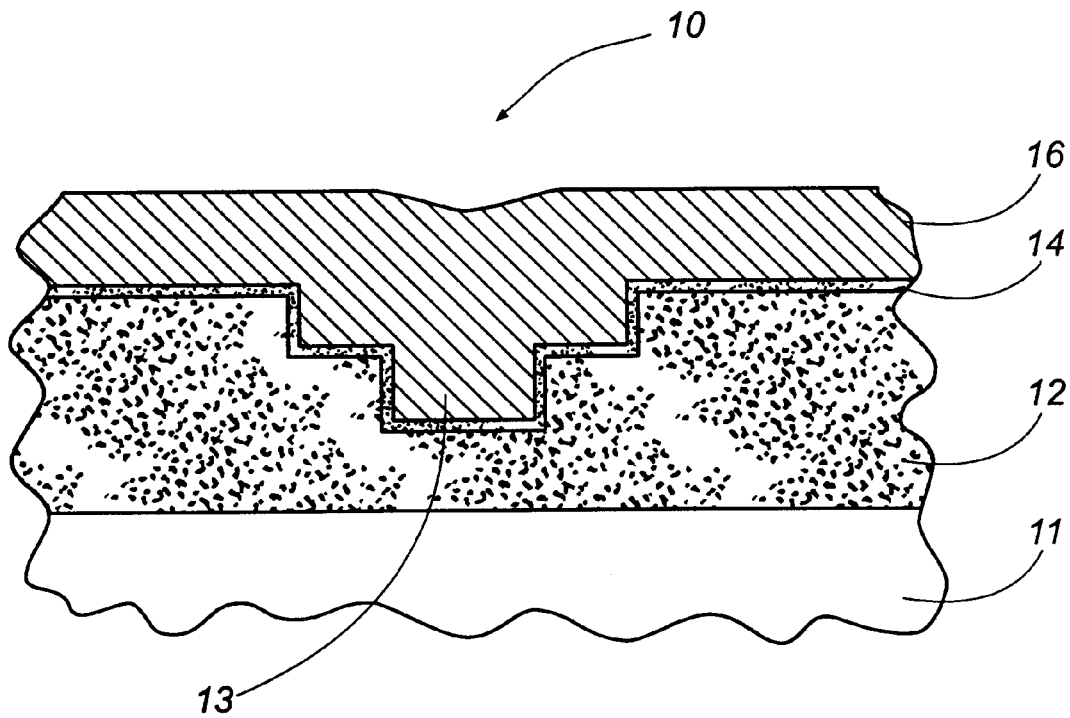
FIG. 1 is a cross-sectional view of a prior art preformed unpolished semiconductor structure.
Figure 2:
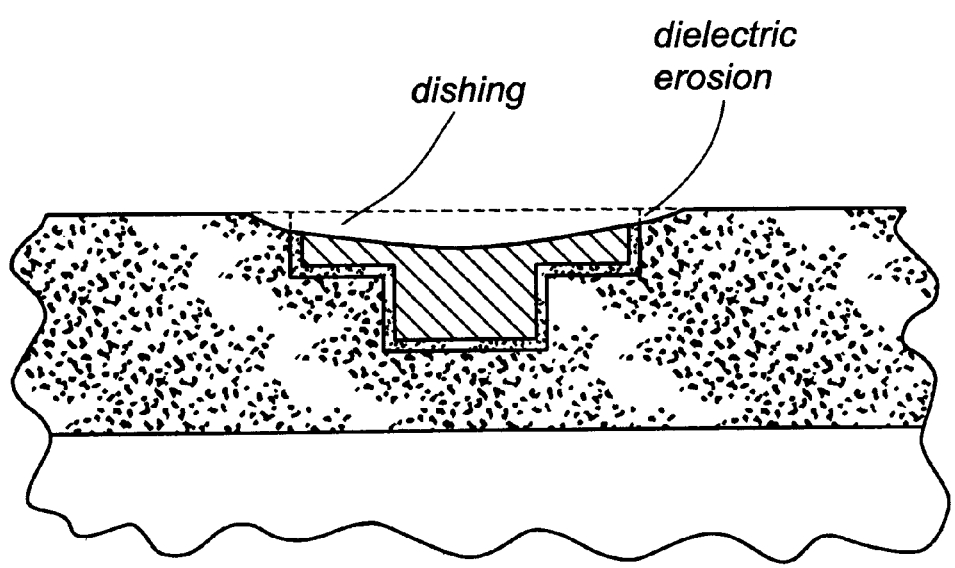
FIG. 2 is a cross-sectional view demonstrating the prior art problems of dishing and erosion.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

The method of the present invention comprises at least two steps of chemical mechanical planarization. In the first step, a first polishing slurry having a plurality of first abrasive particles is used. In the second step, a second polishing slurry containing a plurality of second abrasive particles is used. Preferably, the method of this invention further comprises a dielectric touch-up step for replanarizing the dielectric surface exposed after the removal of the liner film.

As is known in the art, a polishing slurry for CMP polishing typically comprises an oxidizing agent for chemical etching and abrasive particles for mechanical polishing. Any suitable oxidizing agent known in the art for CMP polishing can be used in the present invention. Examples of oxidizing agents include but are not limited to $H_2O_2$, $Fe(NO_3)_3$, $H_3PO_4$, $HNO_3$, $KMnO_4$, $KIO_3$, $K_3F(CN)_6$, $Ce(NO_3)_4$ and ammonium salts such as ammonium persulfate and ammonium nitrate. As will be apparent to a skilled artisan, the concentration of the oxidizing agents in the polishing slurries can vary depending on, e.g., the material to be removed, the desired rate of removal, and the like. The oxidizing agent can be dissolved in any suitable solvents. For example, conventional solvents such as water and alcohol can be used in the present invention. The polishing slurry of the present invention can also include modifying agents, e.g., 1, 2, 4-triazole and triazole derivatives such as benzotriazole. Other additives can also be included in the slurry if desired.

Any conventional abrasive particles can be used in the first and second polishing slurry of the present invention so long as the abrasive particles can contribute to the removal of the metallization layer and/or the liner film. That is to say, the abrasive particles when used in the polishing slurry should be hard enough to mechanically remove the surface material and thus capable of increasing the polishing rate. Preferably, the abrasive particles are also selected such that they do not scratch the dielectric surface once the liner film has been removed.

Typically, aluminum oxide or alumina particles, silica particles, ceria particles, or a combination thereof are used as the abrasive particles in the polishing slurry. Preferably, alumina and/or silica particles are used in the present invention. The abrasive particles are typically provided in an aqueous dispersion that can include buffers or other additives.

In accordance with this invention, the abrasive particles in the first polishing slurry have a different bulk density than the abrasive particles in the second polishing slurry. As used herein, the term "bulk density" means the average density of the agglomerated abrasive particles in the slurry as determined by dividing the total weight of the abrasive particles by a calculated volume of particles excluding pores and voids in the particles. While not wishing to be bound by any theory, it is believed that the bulk density of the abrasive particles generally reflects the hardness of the abrasive particles and therefore that the bulk density of the abrasive particles affects the CMP polishing rate. Typically, the higher the bulk density is, the harder the particles are, and the higher the polishing rate will be. It is believed that this is because as the bulk density increases, the porosity decreases and the content of harder (e.g. alpha-crystalline phase) particles increases thus leading to increased hardness and elastic modulus. The bulk density of abrasive particles can be determined by any suitable method known in the art, such as hydrometers, displacement float devices, or direct mass measurements.

In a preferred embodiment, the same type of abrasive particles (i.e. particles having the same chemical formula) are used in the first and second polishing steps and the bulk density of the abrasive particles in the first polishing slurry is higher than the bulk density of the abrasive particles in the second polishing slurry. With a reduced abrasive particle bulk density, the removal of the metallization material in the second step by CMP polishing is typically at a lower rate. As a result, the CMP polishing can be better controlled to achieve greater uniformity on the polished surface thus minimizing dishing of the metallization lines or vias.

In a second preferred embodiment, different types of abrasive particles are used in the first and second polishing steps and the bulk density of the abrasive particles in the first polishing slurry is higher than the bulk density of the abrasive particles in the second polishing slurry. For example, alumina particles can be used in the first polishing step and silica particles having a bulk density less than the bulk density of the alumina particules can be used in the second polishing step. Whether the same or different types of abrasive particles are used in the first and second polishing steps, the choice of the abrasive particles that are used in these polishing steps depends on the material being polished, the dielectric material used, and other parameters of the polishing process as would be understood by those skilled in the art.

The portion of the metallization and liner film that fills the trenches and holes is preferably not removed in the CMP steps. In other words, preferably little or no dishing or overpolishing results in accordance with the invention. Therefore, in referring to the amount of metallization and liner film removed during the CMP process steps, the present application does not include the metallization and liner film in the trenches and holes of the semiconductor structure.

In the first polishing step, at least a portion of the metallization layer is removed using the first CMP slurry.

Typically, in the first polishing step, substantially all of the metallization layer superimposed over the liner film is removed. For example, in the first step, at least 75 percent, preferably at least 90 percent, and more preferably about 100 percent of the metallization layer is removed. A portion of the liner film can also be removed in the first step as well.

Because the polishing rate in the first step is generally higher than in the second step, the more metallization material and/or liner film material that is removed in the first step, the less total time is required for the overall polishing process. However, polishing at a high removal rate often makes it difficult to control the polishing to achieve uniformity and tends to cause dishing in the surface of the metallization lines or vias. Therefore, typically the first step should be stopped and the second step should be started before the liner film is substantially removed. For example, less than about 50%, preferably less than about 25%, and most preferably less than about 10% of the liner film is removed in the first polishing step.

Advantageously, it is often desirable to stop the CMP polishing in the first step after the liner film has been exposed. It will be apparent to a skilled artisan that the optimal extent of removal in the first step is determined by factors including, e.g., the total processing time desired, the polishing rate in the first and second steps, and the susceptibility of the metallization material to dishing. In addition, certain properties of the polishing process such as the carrier rotation, platen rotation, downforce, backforce, and the like, can affect the rate of removal as understood by the skilled artisan.

In a particular process, the CMP polishing in the first step can be controlled by setting the polishing time based on the estimated thickness of the metallization layer and/or the liner film, and by removing the semiconductor wafer from the planarization apparatus and examining the extent of removal. Any conventional endpoint monitoring systems known in the art can be used. Preferably, an in situ method is used. Examples of in situ endpoint detection methods include, e.g., detecting the change of friction as disclosed in, e.g., U.S. Pat. No. 5,036,015; acoustical methods as disclosed in, e.g., U.S. Pat. Nos., 5,222,329 and 5,240,552; and thermal methods as disclosed in, e.g., U.S. Pat. Nos. 5,196,353 and 5,643,050.

Once the CMP polishing in the first step is stopped, the wafer can be taken to another platen to start the CMP polishing in the second step. A second slurry containing abrasive particles having a different, typically lower, bulk density is then used. Alternatively, the same platen can be used for the first and second step, and the first polishing slurry replaced with a second slurry having abrasive particles with a different bulk density. Preferably, during the transition period, the polishing slurry used in the first step is completely removed and the wafer and pad are rinsed with deionized water to remove any residual amounts of the first slurry. However, instead of rinsing, the slurry being fed to the wafer and pad can be changed in situ from the first slurry to the second slurry during the CMP process.

In the second polishing step, at least a portion of the liner film is removed using the second polishing slurry. The CMP polishing in the second step is preferably stopped after the liner film is completely removed and the polishing pad has reached the dielectric layer exposed after the removal of the liner film. The CMP polishing in this step can be controlled and monitored by the same methods described above including, e.g., friction-detecting methods, acoustical methods, and thermal methods.

Typically, the method of the invention also includes a "touch-up" step after the second polishing step. Touch-up or buffing is well known in the art and is employed to remove residual liner film materials and to replanarize the exposed dielectric surface to remove scratches and other defects from the surface of the dielectric.

In a preferred embodiment of the invention, the present method is particularly useful for a semiconductor such as semiconductor 10 illustrated in FIG. 1, which has a copper layer 16 superimposed on a liner film 14 such as a Ta/TaN liner film. In the first step of the present invention, a standard conventional CMP polishing is conducted using a first polishing slurry. Preferably, the slurry comprises an oxidizing agent such as ferric nitrate, potassium iodate or hydrogen peroxide. The slurry preferably includes the oxidizing agent in an amount from about 0.5 to about 10 percent by volume. In addition, the slurry preferably has a pH of from about 2 to about 4. Other additives or buffers can also be used in the first polishing slurry. For example, appropriate surfactants can be added to the slurry to prevent slurry agglomeration.

Alumina particles are preferred as the abrasive particles in the first polishing step although silica or ceria can also be used in accordance with the invention. The abrasive particles in the first step preferably have a bulk density of at least about 3.5 g/cc. For example, the abrasive particles used in the first step preferably have a bulk density of between about 3.5 and about 4.0 g/cc, more preferably between about 3.6 and 3.9 g/cc. Alumina particles suitable for use as abrasive particles in CMP polishing are well known in the art and can be obtained by any conventional means. For example, suitable alumina particles can be obtained by the thermal decomposition of aluminum hydroxide. Particles with different porosities and crystalline morphologies, i.e., different bulk densities, can be obtained by varying the decomposition temperature and/or time. The porosity and crystalline morphology can be determined using, e.g. surface area or x-ray diffraction measurements.

By using a polishing slurry having particles with a high bulk density, the copper layer 16 can be removed at a relatively high speed, thus reducing the overall time required for the whole CMP polishing process and increasing the processing efficiency. The first step CMP polishing using the first polishing slurry as described above may be stopped as soon as the copper layer 16 is completely removed, or when the CMP polishing pad has reached the liner film 14. However, as described above, in any event, it must be stopped before the liner film 14 is substantially removed.

Figure 3:
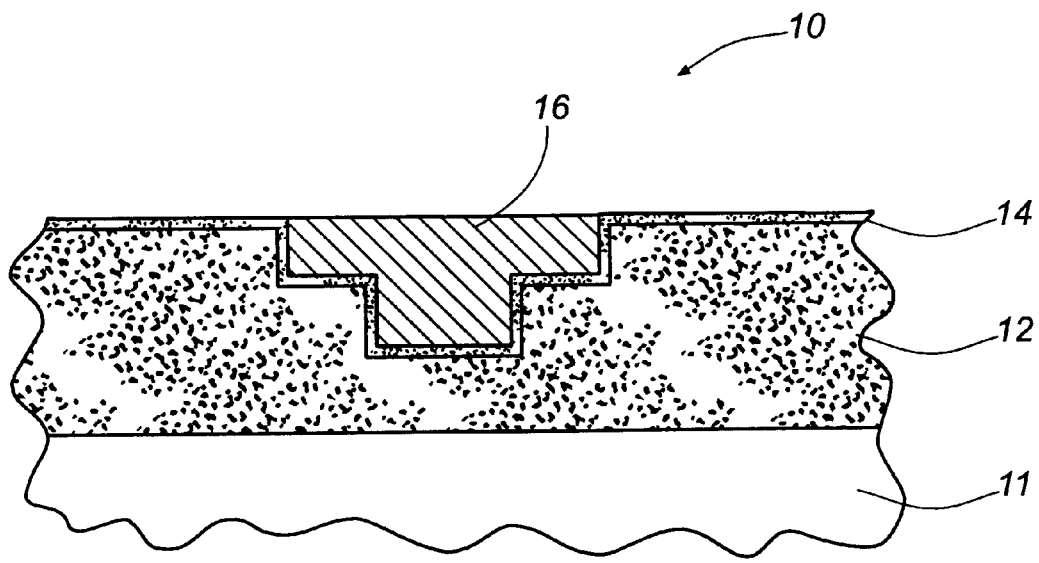
FIG. 3 is a cross-sectional view of a semiconductor structure of FIG. 1, in which the metallization material superimposed over the liner film has been removed by CMP polishing according to the subject invention.

Methods and devices for endpoint detection are well known in the art, and any suitable conventional methods as described above can be used for purpose of this invention. Alternatively, the endpoint of the first step may be determined simply by estimating the polishing time based on the average thickness of the copper layer 16 and/or the liner film 14, as well as the copper and liner film polishing rates. Preferably, the first CMP polishing step is stopped when the copper layer 16 is removed and the liner film 14 is exposed, as shown in FIG. 3.

In the second step of the preferred method of the present invention, CMP polishing is conducted to remove the liner film 14. The second polishing step uses a second polishing slurry that contains abrasive particles having a bulk density of less than the bulk density of the abrasive particles used in the first step. Silica particles are preferred for use in the second polishing step because it is believed that they produce less defects than other types of abrasive particles but alumina and ceria particles can also be used. Suitable silica particles can be formed, for example, in solution by condensing orthosilicic acid, $Si(OH)_4$, to produce colloidal silica particles. The particle size, shape, and bulk density can be controlled by varying the pH, the initial concentration of $Si(OH)_4$, and the presence or absence of salts in the solution.

Typically, the abrasive particles in the second step have a bulk density of less than about 3.5 g/cc. For example, the bulk density of the abrasive particles is from about 3.0 to about 3.5 g/cc, preferably from about 3.1 to about 3.4 g/cc, and more preferably from about 3.2 to about 3.3 g/cc. The oxidizing agent used in the second polishing slurry can be the same or different from the oxidizing agent used in the first polishing slurry. Any suitable oxidizing agent for polishing the material used in the liner film (e.g. tantalum or tantalum nitride) can be used. The first and second slurry can also have the same or different oxidizing agent concentrations.

Preferably, the second slurry includes an oxidizing agent such as ferric nitrate. The concentration of the oxidizing agent in the second polishing slurry can range from about 0.5 to about 10 percent by volume, preferably between about 1 and about 5 percent by volume. The pH of the second polishing slurry can be from about 1 to about 6, preferably from about 2 to about 4. In addition, advantageously, a corrosion-inhibiting additive such as 1, 2, 4-triazole or a triazole derivative (e.g. benzotriazole) can be added in the second polishing slurry at a concentration of from about 0.01 M to about 0.1 M, preferably from about 0.02 M to about 0.04 M. Triazole additives are useful in further reducing the copper polishing rate without affecting the speed of removal of the liner film 14. While not wishing to be bound by any theory, it is believed that triazole derivatives such as benzotriazole form a copper-benzotriazole film thus preventing copper dissolution by the oxidizing agent and mechanical polishing of the copper by the alumina particles.

Figure 4:
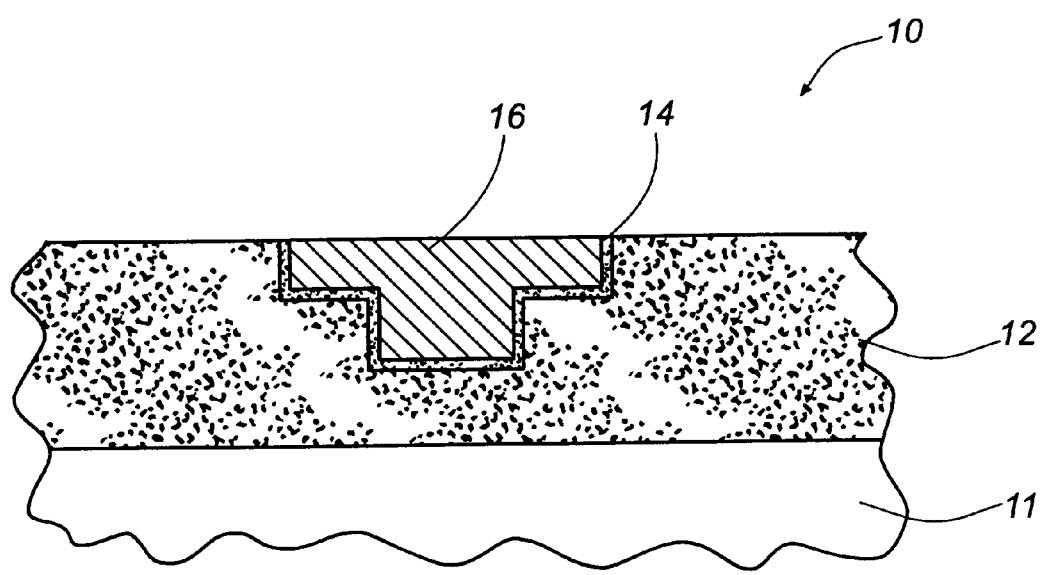
FIG. 4 illustrates a cross-sectional view of a finished product after CMP polishing according to the subject invention.

As shown in FIG. 4, the second step of the method of the present invention is stopped after the liner film 14 is removed thereby exposing the dielectric layer 12. The endpoint detection for guiding the timing of the stopping of the second CMP polishing step can be any one of the methods described above in connection with stopping of the first CMP polishing step.

Optionally, the method of the present invention includes an additional dielectric "touch-up" step for removing any residual portion of the liner film and for polishing the exposed dielectric surface to remove any scratches and other defects caused by the CMP polishing steps. "Touch-up" steps are well known in the art and suitable methods would be apparent to a skilled person in the art.

Thus, in accordance with the present invention, a multi-step method for chemically and mechanically polishing a semiconductor material to remove a liner film and a layer of metallization material superimposed over the liner film is provided. This method can significantly minimize or eliminate dishing and dielectric erosion while providing a desirable planar surface. Particularly, the method of this invention is especially suitable for removing copper layers and liner films from a semiconductor material. The use of a polishing slurry having different abrasive particle bulk densities in different steps allows the flexible control of the overall processing efficiency while significantly preventing dishing of the metallization in the vias or lines in the dielectric surface.

Many modifications and other embodiments of the invention will come to mind to one skilled in the art to which this invention pertains having the benefit of the teachings presented in the foregoing descriptions and the associated drawings. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed:

1. A method for removing at least a portion of a liner film and a metallization layer superimposed over the liner film to expose an underlying dielectric layer on a semiconductor wafer, said method comprising the steps of:

removing at least a portion of said metallization layer by chemical mechanical polishing the metallization layer using a first polishing slurry having a plurality of first abrasive particles; and removing at least a portion of said liner film by chemical mechanical polishing the liner film using a second polishing slurry having a plurality of second abrasive particles, wherein said first abrasive particles and said second abrasive particles have respective first and second particle bulk densities and the first particle bulk density is different than the second particle bulk density.

2. The method of claim 1, wherein the first particle bulk density is higher than the second particle bulk density.

3. The method of claim 1, wherein said metallization layer comprises copper.

4. The method of claim 1, wherein said liner film comprises tantalum or tantalum nitride.

5. The method of claim 1, wherein said first and second abrasive particles are alumina particles.

6. The method of claim 1, wherein said first and second abrasive particles are silica particles.

7. The method of claim 1, wherein said first abrasive particles are alumina particles and said second abrasive particles are silica particles.

8. The method of claim 1, wherein the first particle bulk density is greater than 3.5 g/cc and the second particle bulk density is less than 3.5 g/cc.

9. The method of claim 1, wherein said first and second polishing slurries further include ferric nitrate.

10. The method of claim 9, wherein said second polishing slurry further comprises benzotriazole.

11. A method for planarizing a liner film and a copper layer superimposed over the liner film to expose an underlying dielectric layer, said method comprising the steps of:

chemical mechanical polishing at least a portion of said copper layer using a first polishing slurry comprising a plurality of first abrasive particles having a first particle bulk density; and chemical mechanical polishing at least a portion of said liner film using a second polishing slurry comprising a plurality of second abrasive particles having a second particle bulk density, wherein said first particle bulk density is higher than said second particle bulk density.

12. The method of claim 11, wherein said first abrasive particles and second abrasive particles are alumina particles.

13. The method of claim 11, wherein said first abrasive particles and second abrasive particles are silica particles.

14. The method of claim 11, wherein said first abrasive particles are alumina particles and said second abrasive particles are silica particles.

15. The method of claim 11, wherein said first and second polishing slurries include ferric nitrate.

16. The method of claim 15, wherein said second polishing slurry comprises benzotriazole.

17. The method of claim 11, wherein said second particle bulk density is from about 3.0 g/cc to about 3.5 g/cc.

18. The method of claim 11, wherein said first particle bulk density is from about 3.5 g/cc to about 4.0 g/cc.

19. The method of claim 11, wherein said liner film comprises tantalum or tantalum nitride.

20. A method for planarizing a liner film and a copper layer superimposed over the liner film to expose the underlying dielectric layer, said method comprising the steps of:

chemical mechanical polishing at least a portion of a copper layer using a first polishing slurry containing ferric nitrate and alumina particles having a bulk density of between about 3.6 g/cc and about 3.9 g/cc; and chemical mechanical polishing at least a portion of liner film using a second polishing slurry containing ferric nitrate, benzotriazole, and alumina or silica particles having a particle bulk density of between about 3.1 g/cc to about 3.4 g/cc.

* * * * *